United States Patent [19]

Holberg et al.

[11] Patent Number: 4,849,662

[45] Date of Patent: Jul. 18, 1989

[54] SWITCHED-CAPACITOR FILTER HAVING DIGITALLY-PROGRAMMABLE CAPACITIVE ELEMENT

[75] Inventors: Douglas R. Holberg, Austin; Eric J. Swanson, Buda, both of Tex.

[73] Assignee: Crystal Semiconductor Corporation, Austin, Tex.

[21] Appl. No.: 851,805

[22] Filed: Apr. 14, 1986

[51] Int. Cl.[4] ..................... H03H 15/02; H03H 9/64; H03H 19/00

[52] U.S. Cl. .................................. 307/520; 328/167; 364/825

[58] Field of Search ................ 307/520, 521; 328/167; 333/172, 173; 330/9, 107; 364/724, 825

[56] References Cited

U.S. PATENT DOCUMENTS

| 3,914,763 | 10/1975 | Green et al. | 328/167 |
|---|---|---|---|
| 4,244,030 | 1/1981 | Albarello | 328/167 |
| 4,392,068 | 7/1983 | Welles, II | 307/520 |
| 4,468,749 | 8/1984 | Kato et al. | 307/520 |
| 4,549,312 | 10/1985 | Michaels et al. | 328/167 |

OTHER PUBLICATIONS

Allstot et al, "Electrically-Programmable Switched Cap Filter", IEEE Journal of Solid-State Circuits, vol. SC-14, No. 6, Dec. 1979, pp. 1034-1041.
Broton et al., "Time Multiplexed Active Filters", IEEE JSSC, vol. SC-7, No. 3, Jun. 1972, pp. 259-265.
Cox et al., "Realtime Programmable Switched Cap. Filter", IEEE Solid-State Conference, Feb. 1980, pp. 94, 95, and 264.
Gregorian, "Filtering Techniques with Switched Cap. Circuits", Microelectronics Journal, vol. 11, No. 2, Mar.-Apr. 1980, pp. 13-21.
Kleine et al., "Real-Time Programmable Unit-Element SC Filter for LPC Synthesis", Electronic Letters, vol. 17, No. 17, Aug. 20, 1981, pp. 600-602.

Primary Examiner—Stanley D. Miller
Assistant Examiner—Timothy P. Callahan
Attorney, Agent, or Firm—Leonard & Lott

[57] ABSTRACT

A method and circuitry for time-sharing a digitally-programmable capacitive element, particularly in conjunction with a switched-capacitor filter circuit. The method includes: selecting a first capacitance value for the capacitive element; initializing the charge on the capacitive element; connecting the capacitive element to first preselected nodes of an electronic circuit; disconnecting the capacitive element from the first preselected nodes of after any charge transfer has substantially been completed; changing the capacitance of the capacitive element to a new desired value; initializing the charge on the capacitive element; and then connecting the capacitive element to other preselected nodes of the electronic circuit. A biquad switched-capacitor filter circuit is configured to use such method in its operation.

3 Claims, 4 Drawing Sheets

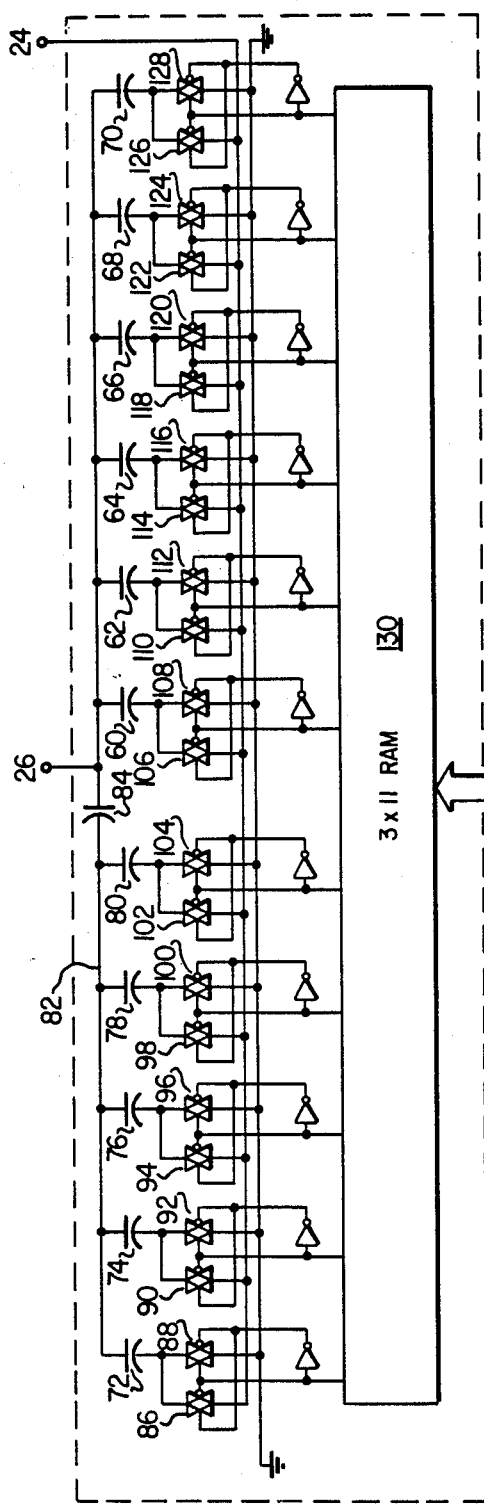
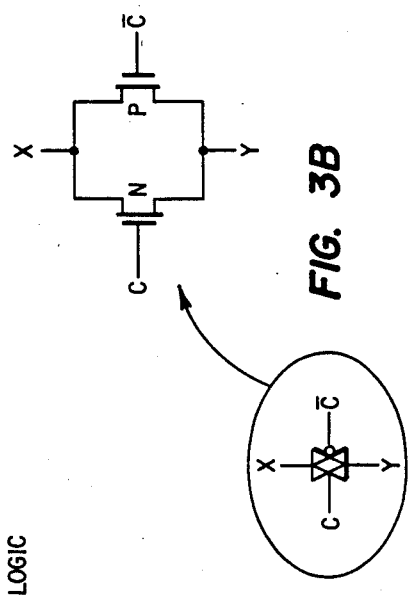
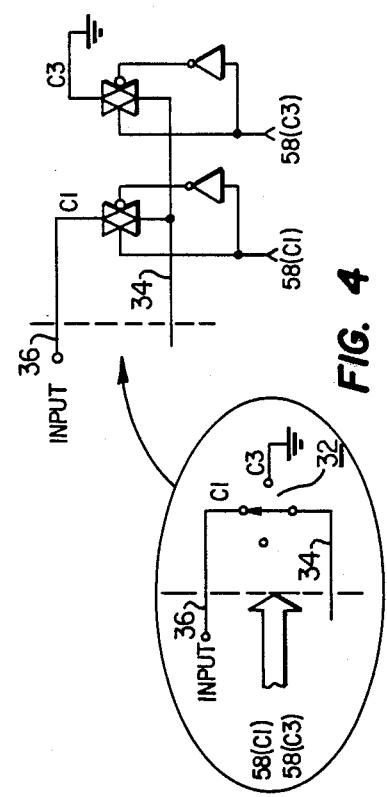
FIG. 3A
FIG. 3B
FIG. 4

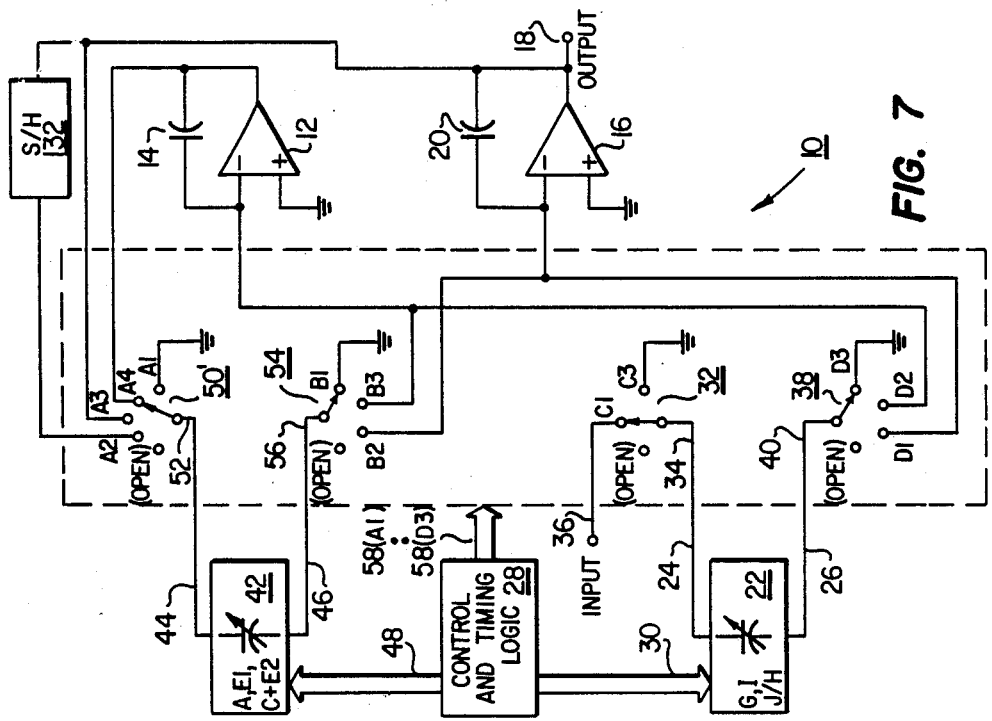
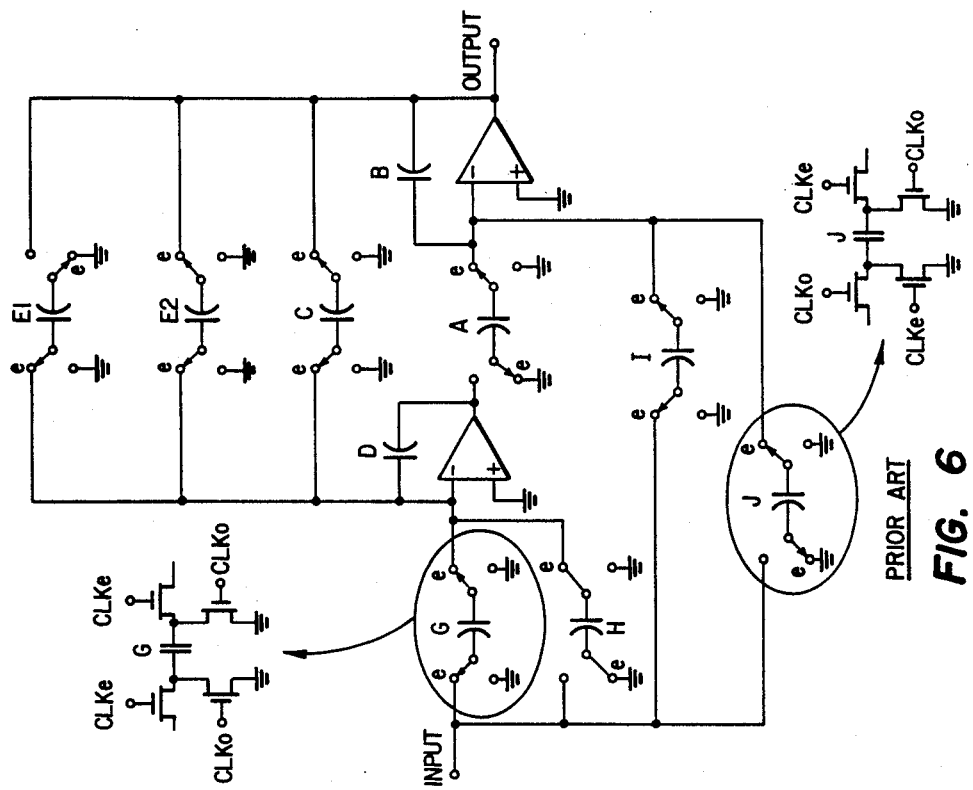

SWITCHED-CAPACITOR FILTER HAVING DIGITALLY-PROGRAMMABLE CAPACITIVE ELEMENT

TECHNICAL FIELD

The present invention generally relates to electronic systems and, more particularly, is concerned with a method for time-sharing a capacitive element among different nodes of an electronic circuit and is concerned with switched-capacitor filters utilizing such method.

BACKGROUND OF THE INVENTION

It is desirable in MOS integrated circuits to minimize the chip area required to perform a given function. In this regard, it is generally advantageous to reduce the total amount of on-chip capacitance.

A circuit which typically utilizes several capacitors and which is conveniently embodied in an MOS integrated circuit is the switched-capacitor filter. The switched-capacitor filter is a type of analog filter wherein resistors are replaced by combinations of capacitors and switches. Various configurations for these circuits have heretofore been developed. In such circuits, it is the usual case that the filters' response characteristics are determined by capacitor ratios rather than by absolute capacitance values. It is also the usual case for these circuits to include differential amplifiers and for the switches of the circuit to be implemented with MOS enhancement-mode transistors.

Included among the various switched-capacitor filter circuits that have previously been developed, is one called a biquad which includes two differential amplifiers connected as integrators. The biquad switched-capacitor filter circuit typically requires the use of at least five switched capacitors. The values of those capacitors together with the choice of one of various possible arrangements of the capacitors determines the type of filter (high pass, low pass, or band pass, for example) and other characteristics of the filter.

For a fixed, specific filter application, appropriate capacitance values can be calculated and the circuit can be implemented with fixed capacitances. For greater versatility, though, it has heretofore been demonstrated that the response of a switched-capacitor filter can be dynamically varied by utilizing variable capacitors in the circuit.

An extremely versatile, dynamically changeable filter would result if every switched-capacitor in a conventional biquad filter was variable or programmable over a wide range of capacitance values. Considerable chip area, though, would likely be required to implement such a circuit in an MOS integrated circuit. Moreover, because it is frequently desirable to embody several filters in an integrated circuit (to make high-order filters, for example), the chip area problem could be compounded.

A technique heretofore known for reducing the number of components required for a bank of switched-capacitor filters is the sharing of an amplifier among a number of filters in a time multiplexed manner, thereby reducing the number of amplifiers required and reducing chip area. That approach, however, does not reduce the number of capacitors or the total amount of capacitance required for a switched-capacitor filter, nor does that approach provide a versatile, dynamically changeable filter.

In accordance with the foregoing, a need exists for a method for reducing the number of capacitive elements required in electronic circuits, and especially in switched-capacitor filter circuits. A need also exists for versatile, dynamically changeable circuitry which can conveniently be embodied in an MOS integrated circuit, and wherein the required number of capacitive elements is minimized.

SUMMARY OF THE INVENTION

The present invention provides a method and circuitry for time-sharing a digitally-programmable capacitive element, allowing the number of capacitors required in an electronic circuit to be reduced. The method and circuitry are particularly advantageous for use in switched-capacitor filter circuits implemented in an MOS integrated circuit. In such an application, the invention can result in a savings of chip area while simultaneously providing a highly versatile, dynamically changeable filter.

In accordance with one aspect of the invention, a programmable capacitive element, the capacitance of which may be varied in response to digital logic signals, is time-shared or multiplexed by sequentially connecting the two terminals of the programmable capacitive element to preselected nodes of an electronic circuit while synchronously selecting desired capacitance values for the programmable capacitive element.

In accordance with another aspect of the invention, a biquad switched-capacitor filter circuit includes two digitally-programmable capacitive elements, each of which is selectively connected in a sequential manner to appropriate nodes of the filter circuit in response to control and timing logic signals.

As is apparent from the foregoing summary, it is a general object of the present invention to provide a novel and improved method and circuitry for a multiplexed capacitive element.

Other objects and advantages, and a more complete understanding of the invention may be obtained by referring to the following detailed description of preferred embodiments when taken in conjunction with the accompanying drawings.

BRIEF DESCRIPTION OF THE DRAWINGS

FIG. 3A is a block and circuit functional diagram illustrating a digitally-programmable capacitive element utilized in the biquad switched-capacitor filter of FIG. 2.

FIG. 3B illustrates a circuit implementation of a switching element utilized in the digitally-programmable capacitive element of FIG. 3A.

FIG. 4 illustrates a logic implementation for a switch of the type utilized in the switched-capacitor filter of FIG. 2.

FIG. 6 is a circuit functional diagram of the prior art illustrating an alternative embodiment of a biquad switched-capacitor filter.

FIG. 7 is a block and circuit functional diagram illustrating an alternative preferred embodiment of a biquad switched-capacitor filter in accordance with the present invention and which is functionally similar to the filter circuit of FIG. 6.

DETAILED DESCRIPTION OF PREFERRED EMBODIMENTS

Figure 1:
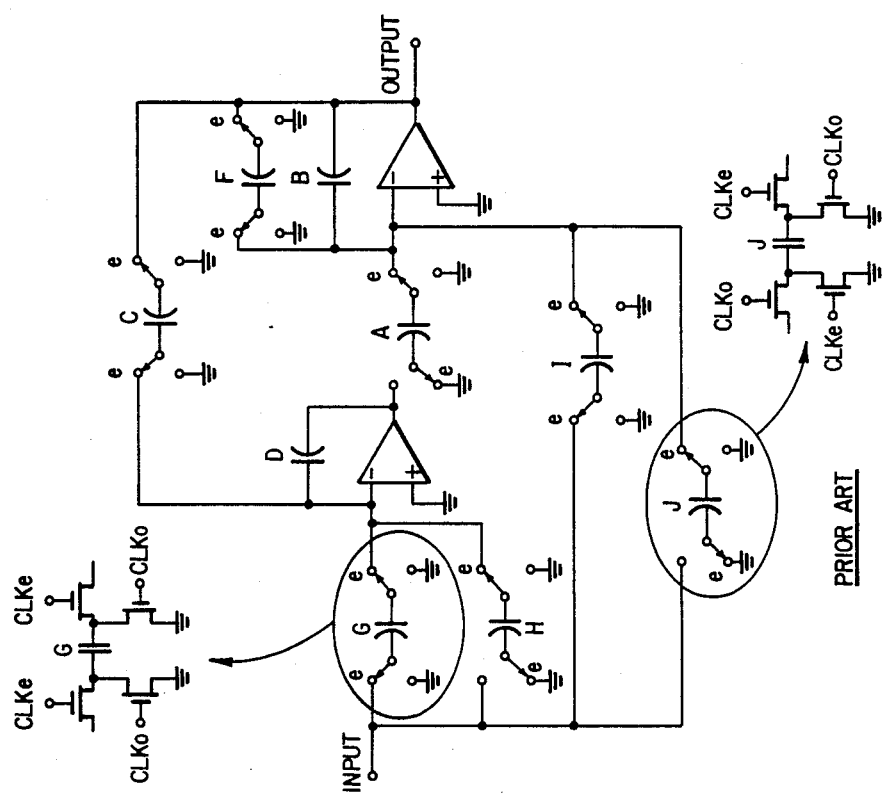
FIG. 1 is a circuit functional diagram of the prior art illustrating a conventional biquad switched-capacitor filter.

Referring now to FIG. 1, there is illustrated a conventional biquad switched-capacitor filter. Included therein are two differential amplifiers, each of which has a fixed capacitor connected from its output to its inverting input. The noninverting input of each differential amplifier is connected to ground. As illustrated, the filter further includes seven switched capacitors, designated therein as capacitors A, C, F, G, H, I, and J. Each terminal of each of the switched capacitors may be connected either to ground or to a signal node in response to clock signals CLKe and CLKo. The signals CLKe and CLKo are even and odd non-overlapping clock phases which run continuously. These clock phases are typically operated at a frequency of at least ten times higher than the highest frequency allowed for the INPUT signal. For a given clock frequency, the transfer characteristic of the circuit is substantially determined by capacitance ratios. A selection of proper values for the capacitors permits the realization of low-pass, high-pass, band-pass, band-reject, and other types of filters. For many of the possible filters, it is not necessary to include every type of switched capacitor; for example, it is generally only necessary to include either the H capacitor or the J capacitor, but not both. Accordingly, in the conventional biquad switched-capacitor filter of the type illustrated in FIG. 1, no more than six switched capacitors are typically required.

As additionally illustrated in FIG. 1, the switches utilized in the circuit may conveniently be implemented with MOS enhancement-mode transistors. Because capacitors and differential amplifiers may also be conveniently implemented with MOS integrated circuit fabrication technology, the circuit is suitable for being embodied in an MOS integrated circuit.

Figure 2:
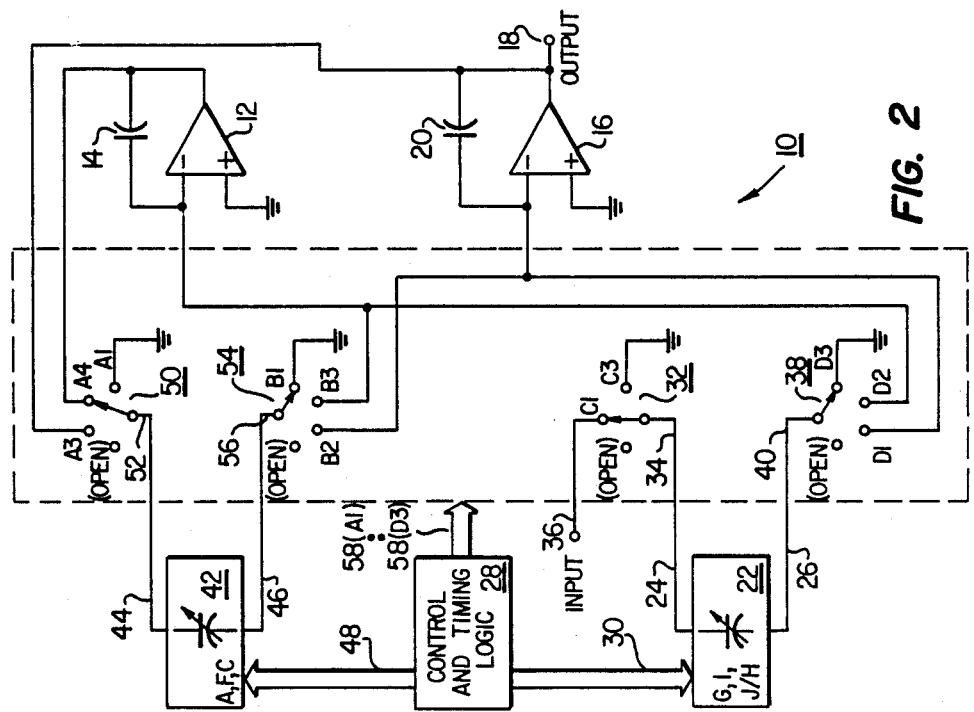
FIG. 2 is a block and circuit functional diagram illustrating a biquad switched-capacitor filter in accordance with the present invention.

Referring now to FIG. 2, a block and circuit functional diagram illustrates a biquad switched-capacitor filter in accordance with the present invention wherein only two switched capacitors are required. The filter circuit of FIG. 2 is indicated generally by the numeral 10.

The filter 10 includes a first differential amplifier 12, the non-inverting input of which is connected to ground. A first feedback capacitor 14 is connected between the output and inverting input of the first differential amplifier 12.

Also included in filter 10 is a second differential amplifier 16, the non-inverting input of which is connected to ground. The output of the second differential amplifier 16 is connected to an output node 18. The output node 18 provides the OUTPUT signal of the filter circuit. A second feedback capacitor 20 is connected between the output and inverting input of the second differential amplifier 16.

A first digitally-programmable capacitive element 22 has a first terminal 24 and a second terminal 26. Control and timing logic 28 provides outputs 30 for controlling the operation of the capacitive element 22. A first switch 32 has a common terminal 34 connected to the first terminal 24. The common terminal 34 may selectively be connected to (1) an open circuit, (2) an input node 36 which receives the INPUT signal to the filter 10, or (3) ground. A second switch 38 has a common terminal 40 which is connected to the second terminal 26 of the capacitive element 22. The common terminal 40 may selectively be connected to (1) an open circuit, (2) the inverting input of the second differential amplifier 16, (3) the inverting input of the first differential amplifier 12, or (4) ground.

A second digitally-programmable capacitive element 42 has a first terminal 44 and a second terminal 46. The control and timing logic 28 provides outputs 48 for controlling the operation of the second capacitive element 42. A third switch 50 has a common terminal 52 which is connected to the first terminal 44. The common terminal 52 may selectively be connected to (1) an open circuit, (2) the output of the first differential amplifier 12, (3) the output of the second differential amplifier 16, or (4) ground. A fourth switch 54 has a common terminal 56 which is connected to the second terminal 46 of the capacitive element 42. The common terminal 56 may selectively be connected to (1) an open circuit (2) the inverting input of the second differential amplifier 16, (3) the inverting input of the first differential amplifier 12, or (4) ground.

The control and timing logic 28 provides outputs 58(A1)–58(D3) for controlling operation of the first switch 32, the second switch 38, the third switch 50 and the fourth switch 54.

The elements of the preferred embodiment of FIG. 2 are embodied in an MOS integrated circuit.

The first differential amplifier 12 and the second differential amplifier 16 are implemented in a conventional manner. In a typical design, the cutoff frequency of the filter 10 is limited by the settling times of the first differential amplifiers. Accordingly, it is generally desirable to minimize the settling time of each amplifier.

The first feedback capacitor 14 and the second feedback capacitor 20 are each implemented as a fixed-value capacitor in the preferred embodiment. For an alternative embodiment, either or both of the feedback capacitors could be made to be variable. In the monolithic integrated circuit which embodies the filter 10, each of the feedback capacitors is fabricated from a layer of silicon dioxide sandwiched between two layers of conductive polysilicon. Although it is not necessary that the capacitance of the first feedback capacitor 14 equal that of the second feedback capacitor 20, in the preferred embodiment each is designed to have a capacitance of 12.8 pF.

FIG. 3A provides a block and circuit functional diagram of the capacitive element 22. The capacitive element 22 includes a binary-weighted array of six capacitors 60, 62, 64, 66, 68, and 70. In the preferred embodiment, the capacitor 60 is designed to have a typical capacitance of 0.4 pF. The capacitors 62, 64, 66, 68, and 70 are designed to have typical capacitances of 0.8 pF, 1.6 pF, 3.2 pF, 6.4 pF, and 12.8 pF, respectively. The capacitive element 22 further includes another binary-weighted array of five capacitors 72, 74, 76, 78, and 80. The capacitor 72 is designed to have a typical capacitance of 0.4 pF and the capacitors 74, 76, 78, and 80 are designed to have typical capacitances of 0.8 pF, 1.6 pF, 3.2 pF, and 6.4 pF, respectively. Each of the capacitors 60, 62, 64, 66, 68, and 70 has one terminal directly connected to the second terminal 26. Each of the capacitors 72, 74, 76, 78, and 80 has one terminal connected to a node 82. A capacitor 84 is connected between the second terminal 26 and the node 82. The capacitor 84 is designed to have a typical capacitance of 0.4 pF. Each of the capacitors included in the digitally-programmable capacitive element 22 is fabricated in the MOS integrated circuit from a layer of silicon dioxide sandwiched between two layers of conductive polysilicon in the same manner as the feedback capacitors 14 and 20.

Still referring to FIG. 3A, twenty-two switching elements 86, 88, 90, 92, 94, 96, 98, 100, 102, 104, 106, 108, 110, 112, 114, 116, 118, 120, 122, 124, 126, and 128 are coupled in pairs to the other terminals of the eleven capacitors 60, 62, 64, 66, 68, 70, 72, 74, 76, 78, and 80, allowing the non-common terminal of each of these capacitors to selectively be coupled either to ground or to the first terminal 24. Each of the eleven pairs of switching elements is controlled by outputs from a three word by eleven bit RAM 130. The eleven bit resolution for the capacitive element 22 allows 2,048 different capacitances to appear between the first terminal 24 and the second terminal 26. As utilized in the present invention, each of the three words of the RAM 130 stores the switch configuration information for one of three capacitors, each of the three capacitors being digitally-programmable over a binary range of 2,048 different values. For an alternative embodiment, a read-only memory could be substituted for the RAM 130.

FIG. 3B illustrates a circuit implementation of a switching element of the type utilized in the diagram of FIG. 3A. The switching element is comprised of an N-channel MOS enhancement-mode transistor and a P-channel enhancement-mode transistor connected in a conventional manner as a transmission gate.

Referring again to FIG. 2, the control and timing logic 28 includes a crystal controlled oscillator and conventional latches and digital logic gates. A quartz crystal (not shown) is located off the MOS integrated circuit chip. Hand-wired control and timing logic 28 for the preferred embodiment may be designed and implemented in a simple, straightforward manner. Alternatively, the controlling function of the control and timing logic 28 can be implemented with a microcomputer controller.

A logic implementation for the first switch 32 is illustrated in FIG. 4. In an MOS integrated circuit, the open position of the first switch 32 is accomplished when the outputs 58(C1) and 58(C3) from the control and timing logic 28 are both at logic 0s, causing the switching elements of the first switch 32 to be off. The second switch 38, the third switch 50, and fourth switch 54 are implemented and controlled in the same manner.

Figure 5:
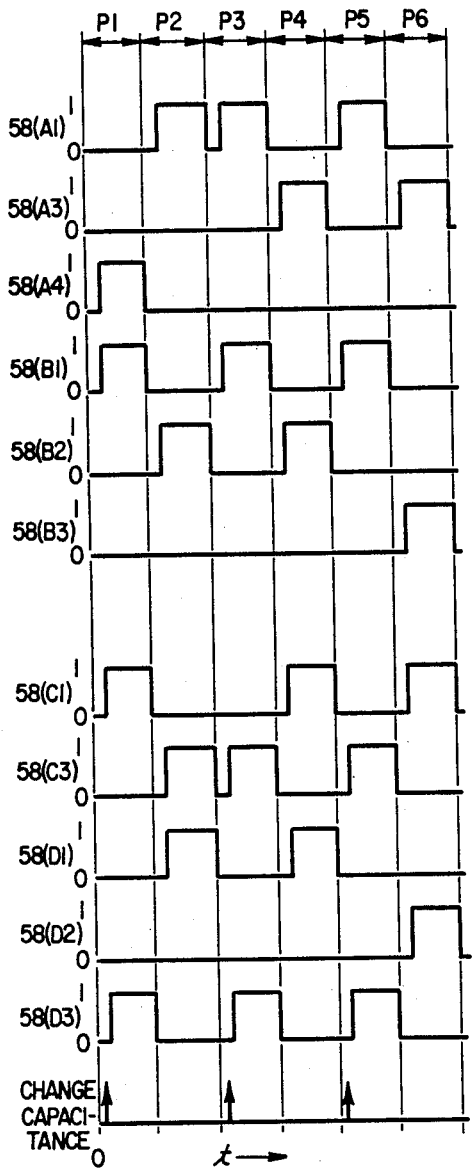
FIG. 5 is a set of waveforms illustrating basic timing and operation of the switched-capacitor filter of FIG. 2.

With reference now to FIG. 5, operation of the filter 10 of FIG. 2 is next described. FIG. 5 is a set of electrical waveforms illustrating the basic timing and operation for the filter circuit of FIG. 2. Each of the waveforms represents the control and timing logic output signal associated with each switching element of the switches 32, 38, 50, and 54. Six phases, designated as P1, P2, P3, P4, P5, and P6, are required to complete one sampling period for the filter 10. By comparison, the conventional switched-capacitor filter of FIG. 1 only requires the completion of two phases for each sampling period. For proper operation, the signals controlling the switching elements should be non-overlapping from one phase to the next. Accordingly, for a short time at the begining of each phase, the terminals of the capacitive elements 22 and 42 are caused to be electrically floating because all switching elements of the switches 32, 38, 50, and 54 are off. Shortly thereafter, during phase one, the first terminal 44 of the capacitive element 42 is connected to the output of the first differential amplifier 12 while the second terminal 46 is approximately simultaneously connected to ground. Consequently, after a sufficient time, the capacitive element 42 is charged to the output voltage of the first differential amplifier 12. At the beginning of phase two, the terminals of the capacitive element 42 are again caused to be electrically floating so that the charge across the capacitor is properly maintained. Next, the first terminal 44 is connected to ground while the second terminal 46 is connected to the inverting input of the second differential amplifier 16.

It should be noted that the two phase operation just described with respect to the capacitive element 42 is analogous to the operation of the capacitor A of the conventional filter of FIG. 1. More specifically, during the first phase, the charge on the switched-capacitor is initialized, and during the next phase that charge is transferred to the feedback capacitance connected between the output and inverting input of the second differential amplifier. For an understanding of the charge transfer mechanism, it should be observed that the configuration of the differential amplifier is one in which the amplifier attempts to maintain a virtual ground at its inverting input. Thus, connecting capacitor A, or its equivalent, to the inverting input of the second differential amplifier causes the charge on the capacitor A to be discharged. But because the inverting input of the differential amplifier is only a virtual ground rather than a true ground, an equal but opposite charge is caused to be added to the feedback capacitor. In accordance with the fundamental principle that the charge on a capacitor is equal to the capacitance times the voltage across the capacitor, a resulting change in output voltage of the differential amplifier is equal to the negative of the voltage initially on the capacitor A, multiplied by the ratio of the capacitance of the capacitor A to the capacitance of the feedback capacitor.

The time required to discharge the capacitor A, or its equivalent as embodied in the capacitive element 42, is a function of the resistance of the switches connected to its terminals. In the preferred embodiment of FIG. 2, the P-channel and N-channel transistors which are used to implement the first switch 32, second switch 38, third switch 50, and fourth switch 54 are each designed to have a width-to-length ratio of 50.

Once the capacitor A, or its equivalent, has been discharged, it is sitting dormant in the circuit, doing nothing and having no effect upon any signal of the circuit. Consequently, it can be disconnected from the nodes to which it is connected and be used elsewhere in the circuit. Before connecting the capacitor to another pair of nodes of the circuit, though, it may be desirable to change its capacitance.

As illustrated in the waveforms of FIG. 5 taken in conjunction with FIG. 2, at the beginning of phase three the first terminal 44 of the capacitive element 42 is disconnected from ground and the second terminal 46 is disconnected from the inverting input of the second differential amplifier 16. The outputs 48 of the control and timing logic 28 then cause the capacitive element 42 to change its capacitance to a new value if desired. Continuing in phase three, both terminals of the capacitive element 42 are connected to ground. At the beginning of phase 4, the terminals of the capacitive element 42 are once again open-circuited; and shortly thereafter, the first terminal 44 is connected to the output of the second differential amplifier 16 and the second terminal 46 is connected to the inverting input of the second differential amplifier 16. By comparison to the conventional filter circuit of FIG. 1, it will be appreciated that the operation of the preferred embodiment of FIG. 2 during phases three and four is analogous to operation of the F capacitor.

Charge on the feedback capacitor 20 is redistributed or transferred during phase four when the capacitive element 42 is connected in parallel with the feedback capacitor 20, resulting in another change of the voltage at the output of the second differential amplifier 16. Once the charge on the feedback capacitor 20 has reached a steady-state condition, the capacitive element 42 can be disconnected without causing a further change in the voltage at the output of the second differential amplifier 16; this is so because both the capacitance and the charge associated with that capacitance are simultaneously removed. The capacitive element 42 is now free to be used elsewhere in the filter circuit.

In the preferred embodiment of FIG. 2, as illustrated by the waveforms of FIG. 5, during phase five the capacitance value of the capacitive element 42 is again changed to a new desired value and the charge on the capacitive element 42 is initialized by connecting both of its terminals to ground. During phase six, in a manner analogous to the operation of capacitor C of the conventional filter of FIG. 1, the terminals of the capacitive element 42 are momentarily open-circuited, and shortly thereafter the first terminal 44 is connected to the output of the second differential amplifier 16 while the second terminal 46 is connected to the inverting input of the first differential amplifier 12.

In accordance with the foregoing, the capacitive element 42 is time-shared or multiplexed among different preselected nodes of the filter 10. In a similar manner, and as illustrated by the waveforms of FIG. 5 taken in conjunction with the diagram of FIG. 2, the first capacitive element 22 is likewise time-shared among different preselected nodes of the filter 10 while the capacitance of the capacitive element 22 is digitally selected as desired. The capacitive element 42 functions analogously to the capacitors A, F, and C of the conventional filter, and the capacitive element 22 functions analogously to the capacitors G, I, and either J or H.

The time-sharing of capacitances equivalent to those of I and G is next described. During phase three, first capacitance value corresponding to that of the I capacitor is selected for the capacitive element 22, and both terminals of the capacitive element 22 are connected to ground for a duration sufficient to substantially remove any charge on the capacitive element 22. At the beginning of phase four, the capacitive element 22 is caused to momentarily become electrically floating by disconnecting its terminals from ground. The capacitive element 22 is then connected between the input node 36 of the filter 10 and the inverting input of the second differential amplifier 16 for a duration sufficient to substantially charge the capacitive element 22 to the value of voltage on the input node 36. In accordance with basic circuit principles, an equal but opposite charge will be added to the second feedback capacitor 20. Next, during phase five, the capacitive element 22 is caused to become electrically floating by disconnecting its terminals from the input node 36 and the inverting input of the second differential amplifier 16. A second capacitance value corresponding to that desired for an equivalent capacitor G is selected for the capacitive element 22, and both terminals of the capacitive element 22 are connected to ground for a duration sufficient to substantially remove any charge on the capacitive element 22. It should be apparent that it makes no difference whether the capacitance value is first changed and then the terminals of the capacitive element are grounded or vice-versa. After any charge is removed from the capacitive element 22, it is caused to become electrically floating at the beginning of phase six by disconnecting both of its terminals from the ground node. It should be further apparent that the selection of a new capacitance value could as well be performed at this time. To complete the transfer of charge analogous to operation of a G capacitor, the capacitive element 22 is connected between the input node 36 and the inverting input of the first differential amplifier 12 for a duration sufficient to substantially charge the capacitive element 22 to the value of voltage on the input node 36, resulting in an equal but opposite charge being transferred or added to the first feedback capacitor 14, and thereby causing the output voltage of the first differential amplifier 12 to be adjusted accordingly.

The foregoing operation is summarized in Table I. It should be noted that the output of the filter 10 at the output node 18 is not a valid output during all six of the phases of the sampling cycle. The output is valid only after charge transfers associated with capacitances analogous to capacitors A, J, F, and I have been completed. This condition is achieved by the end of phase four. The output remains valid through phases five, six, and phase one of the next sampling cycle. The output, however, becomes invalid during phase two of that next sampling cycle when the charge associated with the capacitance equivalent to that of capacitor A is transferred to the feedback capacitor of the second differential amplifier 16. The output then remains invalid until sufficient time has passed in phase four for the charging associated with the equivalent of the "F" and "I" transfers to be completed. A conventional sample-and-hold circuit, sampled when the output node 18 is providing a valid output voltage, can be connected to the output of the filter 10 if a continuously valid sampled-data output signal is needed.

Table II summarizes operation of the preferred embodiment when a capacitor analogous to capacitor H rather than capacitor J is utilized. By comparison to the operation summarized in Table I, the only change is during phase two and only concerns closures of the first switch 32 and the second switch 38.

Referring now to FIG. 6, there is illustrated a circuit functional diagram of an alternative embodiment of a two phase biquad switched-capacitor filter. The difference of this circuit from that of FIG. 1 is that the F capacitor is removed from the circuit and a pair of E capacitors are connected between the output of the filter and the inverting input of the first differential amplifier. It has heretofore been shown in the prior art that a pair of switched capacitors of equal value and connected in parallel, as illustrated for E1 and E2 in FIG. 6, are equivalent to a single fixed capacitance. In practice, it is convenient to combine the capacitor C and the capacitor E2 as a single switched-capacitor. By customary terminology, a circuit of the type illustrated in FIG. 1 is referred to as an F circuit, whereas the circuit of FIG. 6 is referred to as an E circuit.

Referring now to FIG. 7, there is illustrated a block and circuit functional diagram of an alternative preferred embodiment of a biquad switched-capacitor filter circuit in accordance wih the present invention and which is functionally similar to the filter circuit of FIG. 6. A difference of the embodiment of FIG. 7 by comparison to that of FIG. 2 is the connection of the input of a sample-and-hold circuit 132 to the output node 18, and with the output of the sample-and-hold circuit 132 being connected to a terminal of a modified third switch 50 in order that the output of the sample-and-hold circuit 132 can selectively be connected to the first terminal 44 of the capacitive element 42. The function of the sample-and-hold circuit 132 is to preserve a valid output voltage from one sampling cycle until the charge on the capacitance equivalent to E1 has been initialized during phase three of the next sampling cycle.

Figure 8:
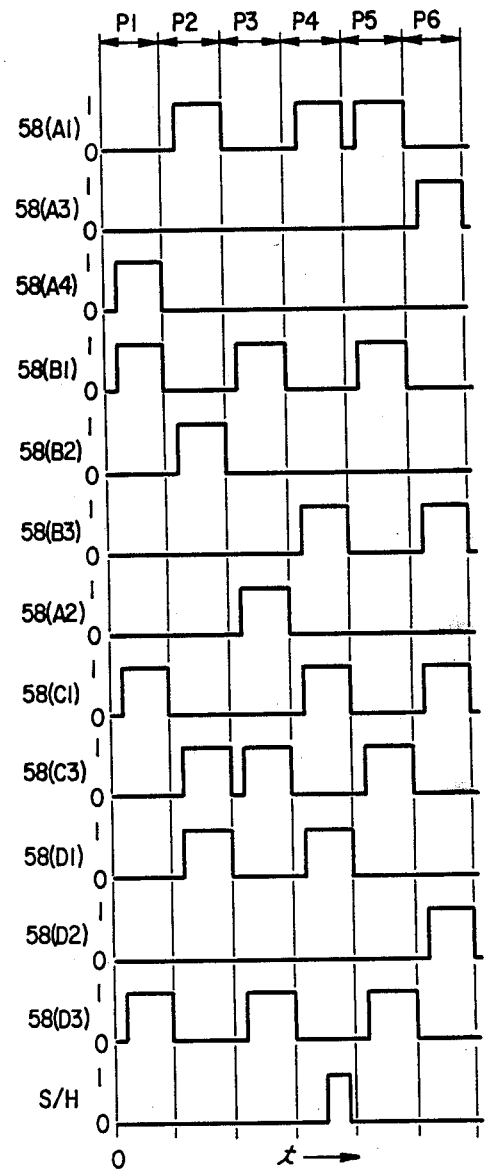
FIG. 8 is a set of waveforms illustrating basic timing and operation of the switched-capacitor filter of FIG. 7.

FIG. 8 provides a set of waveforms illustrating the basic timing and operation for the filter circuit of FIG. 7. As shown in those waveforms, the sample-and-hold circuit 132 samples its input during phase four.

Operation of the filter circuit of FIG. 7 is summarized in Table III for a filter which utilizes the equivalent of a J capacitor, and is summarized in Table IV for a filter which utilizes the equivalent of an H capacitor.

Preferred embodiments of the present invention have been described. It should be apparent to persons of ordinary skill in the art that various changes may be made in the method and circuitry described without departing from the spirit and scope of the invention. For example, the time-shared multiplexed capacitor techniques described here can be applied to other switched-capacitor biquads and either higher or lower order filters.

TABLE I

"F" CIRCUIT WITH J CAPACITOR

| PHASE | CLOSURES OF 3RD & 4TH SWITCHES | FUNCTION | CLOSURES OF 1ST & 2ND SWITCHES | FUNCTION |
|---|---|---|---|---|
| P1 | A4-B1 | "A" Initialize | C1-D3 | "J" Init. |
| P2 | A1-B2 | "A" Transfer | C3-D1 | "J" Trans. |
| P3 | A1-B1 | "F" Initialize | C3-D3 | "I" Init. |
| P4 | A3-B2 | "F" Transfer | C1-D1 | "I" Trans. |
| P5 | A1-B1 | "C" Initialize | C3-D3 | "G" Init. |
| P6 | A3-B3 | "C" Transfer | C1-D2 | "G" Trans. |

TABLE II

"F" CIRCUIT WITH H CAPACITOR

| PHASE | CLOSURES OF 3RD & 4TH SWITCHES | FUNCTION | CLOSURES OF 1ST & 2ND SWITCHES | FUNCTION |
|---|---|---|---|---|
| P1 | A4-B1 | "A" Initialize | C1-D3 | "H" Init. |
| P2 | A1-B2 | "A" Transfer | C3-D2 | "H" Trans. |
| P3 | A1-B1 | "F" Initialize | C3-D3 | "I" Init. |
| P4 | A3-B2 | "F" Transfer | C1-D1 | "I" Trans. |
| P5 | A1-B1 | "C" Initialize | C3-D3 | "G" Init. |
| P6 | A3-B3 | "C" Transfer | C1-D2 | "G" Trans. |

TABLE III

"E" CIRCUIT WITH J CAPACITOR

| PHASE | CLOSURES OF 3RD & 4TH SWITCHES | FUNCTION | CLOSURES OF 1ST & 2ND SWITCHES | FUNCTION |
|---|---|---|---|---|
| P1 | A4-B1 | "A" Initialize | C1-D3 | "J" Init. |
| P2 | A1-B2 | "A" Transfer | C3-D1 | "J" Trans. |
| P3 | A2-B1 | "E1" Initialize | C3-D3 | "I" Init. |
| P4 | A1-B3 | "E1" Transfer | C1-D1 | "I" Trans. |
| P5 | A1-B1 | "C + E2" Initialize | C3-D3 | "G" Init. |
| P6 | A3-B3 | "C + E2" Transfer | C1-D2 | "G" Trans. |

TABLE IV

"E" CIRCUIT WITH H CAPACITOR

| PHASE | CLOSURES OF 3RD & 4TH SWITCHES | FUNCTION | CLOSURES OF 1ST & 2ND SWITCHES | FUNCTION |
|---|---|---|---|---|
| P1 | A4-B1 | "A" Initialize | C1-D3 | "H" Init. |
| P2 | A1-B2 | "A" Transfer | C3-D2 | "H" Trans. |
| P3 | A2-B1 | "E1" Initialize | C3-D3 | "I" Init. |
| P4 | A1-B3 | "E1" Transfer | C1-D1 | "I" Trans |
| P5 | A1-B1 | "C + E2" Initialize | C3-D3 | "G" Init. |
| P6 | A3-B3 | "C + E2" Transfer | C1-D2 | "G" Trans |

What is claimed is:

1. A method for multiplexing a digitally-programmable capacitive element in a switched-capacitor filter circuit, said switched-capacitor filter circuit having a differential amplifier and a ground node, comprising:
   a. coupling said digitally-programmable capacitive element between said ground node and the inverting input of said differential amplifier while digitally selecting a first desired capacitance value for said capacitive element; and thereafter performing the following steps in the same sampling cycle, b. uncoupling said digitally-programmable capacitive element from between said ground node and the inverting input of said differential amplifier; and thereafter performing the following step in the same sampling cycle, c. coupling said digitally-programmable capacitive element between the inverting input of said differential amplifier and the output of said differential amplifier while digitally selecting a second desired capacitance value for said capacitive element, said second desired capacitive value being different from that of said first desired capacitance value.

2. A biquad switched-capacitor filter circuit having an input node, having an output node, and having a ground node, comprising:

a. a first differential amplifier, the non-inverting input of said first differential amplifier being coupled to ground;

b. a first feedback capacitor coupled between the output and the inverting input of said first differential amplifier;

c. a second differential amplifier, the non-inverting input of said second differential amplifier being coupled to ground, the output of said second differential amplifier being coupled to said output node of said switched-capacitor filter circuit;

d. a second feedback capacitor coupled between the output and the inverting input of said second differential amplifier;

e. a first digitally-programmable capacitive element having first and second terminals;

f. control and timing logic circuitry for controlling the operation of said switched-capacitor filter circuit;

g. a first switch means responsive to said control and timing logic circuitry for selectively coupling said first terminal of said first digitally-programmable capacitive element to:
  (1) an open circuit,
  (2) the input node of the switched-capacitor filter circuit, or
  (3) ground;

h. a second switch means responsive to said control and timing logic circuitry for selectively coupling said second terminal of said first digitally-programmable capacitive element to:
  (1) an open circuit,
  (2) the inverting input of said second differential amplifier,
  (3) the inverting input of said first differential amplifier, or
  (4) ground;

i. a second digitally-programmable capacitive element having first and second terminals;

j. a third switch means responsive to said control and timing logic circuitry for selectively coupling said first terminal of said second digitally-programmable capacitive element to:
  (1) an open circuit,
  (2) the output of said first differential amplifier,
  (3) the output of said second differential amplifier, or
  (4) ground;

k. a fourth switch means responsive to said control and timing logic circuitry for selectively coupling said second terminal of said second digitally-programmable capacitive element to:
  (1) an open circuit,
  (2) the inverting input of said second differential amplifier,
  (3) the inverting input of said first differential amplifier, or
  (4) ground.

3. A biquad switched-capacitor filter circuit according to claim 2 and further comprising a sample-and-hold circuit having an input and an output, the input of said sample-and-hold circuit being coupled to said output node of said switched-capacitor filter circuit, and the output of said sample-and-hold circuit being selectively coupled by said third switch means to said first terminal of said second digitally-programmable capacitive element.

* * * * *